United States Patent [19]

Shtulman

[11] Patent Number: 5,430,401
[45] Date of Patent: Jul. 4, 1995

[54] ELECTRONIC SWITCHES

[75] Inventor: Alexander J. Shtulman, Tucker, Ga.

[73] Assignee: Northern Telecom Ltd., Montreal, Canada

[21] Appl. No.: 935,260

[22] Filed: Aug. 27, 1992

[51] Int. Cl.$^6$ .......................................... H03K 17/687
[52] U.S. Cl. ..................................... 327/434; 327/502
[58] Field of Search .............. 307/566, 570, 575, 577, 307/584; 327/434, 502, 429

[56] References Cited

U.S. PATENT DOCUMENTS

| | | | |
|---|---|---|---|
| 5,006,736 | 4/1991 | Davies | 307/584 |
| 5,010,439 | 4/1991 | Zisa et al. | 307/584 |
| 5,160,862 | 11/1992 | Leipold et al. | 307/570 |
| 5,265,003 | 11/1993 | Kayser et al. | 307/566 |
| 5,281,862 | 1/1994 | Ma | 307/570 |

OTHER PUBLICATIONS

"DPDT FET", J. Markus, Modern Electronic Circuits Reference Manual, p. 957. No date presented.
"FET Analog Switch", J. Markus, Modern Electronic Reference Manual, p. 959. No date presented.
"Solid-State Signal Switching: It's Getting Better All The Time", J. Cohen, EDN Magazine, Nov. 15, 1972, pp. 22-28.
"Bidirectional Analog Switch", J. Markus, Guidebook of Electronic Circuits, p. 862. No date presented.
"Solid-State DPDT Relay", by the Editors of EEE Magazine, Electronic Circuit Design Handbook, p. 372, No date presented.

Primary Examiner—Willis R. Wolfe
Attorney, Agent, or Firm—Foley & Lardner

[57] ABSTRACT

An electronic switch is disclosed for switching relatively high voltages, such as telecommunications voltages of the order of −48 volts, in response to logic levels of typically 0 to 5 volts. The switch comprises a MOSFET having a source-drain switching path and a gate; a control transistor controlled from a logic level control terminal; and a potential divider MOSFET source and the control transistor and having a tapping point coupled to the MOSFET gate. The potential divider includes a zener dime and/or a resistor connected between the MOSFET source and gate. The sinitch can be used with a current sensing resistor and a monostable circuit to fonn an automatically-reset circuit interrupter or electronic fuse.

11 Claims, 2 Drawing Sheets

ELECTRONIC SWITCHES

This invention relates to electronic switches, which term is used herein to include electronic relays, electronic circuit interrupters which can be used to replace mechanical switches and thermal fuses, and other forms of electronic or solid-state switch.

BACKGROUND OF THE INVENTION

It is well known to provide an electronic switch to replace a mechanical switch which may be manually operable or may be constituted by contacts-of a relay. It is also well known that, in order to provide desired characteristics of a low on-resistance (switch closed) and a high off-resistance (switch open), FETs (field effect transistors) are desirably used as the electronic or solid-state switching elements. For example, "Modern Electronic Circuits Reference Manual" by John Marcus, McGraw-Hill Book Company, shows on page 957 under the heading "DPDT FET" an arrangement of four commonlycontrolled FETs constituting a double-pole double-throw switch, and shows on page 959 under the heading "FET Analog Switch" an arrangement of a FET switch with a level-shifting bipolar transistor driver.

The latter and other arrangements are disclosed in an article entitled "Solid-state signal switching: it's getting better all the time" by Joel Cohen, EDN, Nov. 15, 1972, pages 22–28. FIG. 12 of this article shows an analog switch in which an n-channel MOSFET (metal-oxide-semiconductor FET) is used as the switching element with a bipolar transistor driver connected directly to the gate of the MOSFET for applying forward or reverse bias for controlling the switch.

A problem with these arrangements is that, if the source of the MOSFET is connected to the voltage to be switched and the drain of the MOSFET is connected to a load, then the difference between the voltage to be switched by the switch and the control voltage at the gate of the MOSFET is limited by the maximum source-gate voltage permitted for the FET. For most MOSFETs, this maximum voltage difference does not exceed about 20 volts, and this considerably limits the applications of these known electronic switching arrangements. For example, if such a known electronic switch is to be controlled by low voltage logic signals, for example 0 and +5 volts from a CMOS logic circuit, then the voltage to be switched can not exceed about 20 to 25 volts. Such a switch can not be used to switch relatively high voltage signals, such as signals in telecommunications equipment which may have voltages in a range of about −48 to −200 volts.

The known electronic switching arrangements described above are intended to be used with the MOSFET having its gate supplied with control voltages of respectively +15 and −15 volts received from a grounded voltage source, its drain connected to a lesser voltage to be switched, for example within a range of ±10 volts relative to ground, and its source connected via the load to a fixed potential such as ground or 0 volts. Connected in this manner as intended, such known arrangements are not suitable for switched connection of the load between relatively arbitrary potentials in a so-called floating manner, as may also be desirable for switching signals in telecommunications equipment, and are also not suitable for switching relatively high voltage signals.

These limitations could be reduced by controlling the gate of the MOSFET in a manner isolated from the ground potential via an intermediate d.c. to d.c. converter, but this has consequent disadvantages of extra cost, power dissipation, and physical space.

An object of this invention is to provide an improved electronic switch.

SUMMARY OF THE INVENTION

According to one aspect of this invention there is provided an electronic switch, for switching relatively high voltages in response to relatively low voltage logic levels at a control terminal, comprising: a MOSFET having a source coupled to a first switch terminal, a drain coupled to a second switch terminal, and a gate, a source-drain path of the MOSFET constituting a switching path of the electronic switch between the first and second switch terminals; a control transistor having a controlled path, coupled on one side to a relatively low voltage terminal, and a control electrode coupled to the control terminal for rendering the controlled path of the control transistor conductive or non-conductive in response to respective logic levels at the control terminal; and a potential divider coupled between the first switch terminal and another side of the controlled path of the control transistor and having a tapping point coupled to the gate of the MOSFET, for rendering the source-drain path of the MOSFET conductive or non-conductive when the controlled path of the control transistor is respectively conductive or non-conductive.

The potential divider in a switch in accordance with the invention enables the MOSFET to switch relatively high voltages, limited only by the characteristics of the MOSFET, in response to relatively low control voltages, for example of zero and +5 volts provided by CMOS logic circuitry. Furthermore, the second switch terminal, and hence the drain of the MOSFET, can be at a relatively arbitrary voltage and does not have to be at substantially zero volts. Thus the switch can be used easily in a floating configuration with respect to ground or zero volts.

The potential divider conveniently comprises a zener diode, a resistor, or a zener diode and a resistor in parallel with one another, coupled between the first switch terminal and the tapping point. The zener voltage is selected, and/or the resistance of the resistor is selected, to drop a voltage of at least the threshold voltage of the MOSFET, and not more than the maximum gate-source voltage of the MOSFET, between the gate and the source of the MOSFET when the controlled path of the control transistor is conductive.

The control transistor can comprise a bipolar transistor having a base-emitter path coupled via a resistor between the control terminal and the relatively low voltage terminal and having a collector constituting said one side of the controlled path of the control transistor, or it can comprise a field effect transistor having a gate coupled to the control terminal and having a source-drain path constituting the controlled path of the control transistor.

For protection against reverse polities the electronic switch can include at least one diode via which the source-drain path of the MOSFET is coupled between the first and second switch terminals. For switching of arbitrary polarities of voltage the switch can include a diode bridge rectifier via which the source-drain path of the MOSFET is coupled between the first and second switch terminals.

For forming an electronic fuse or circuit interrupter, the switch can include a current-sensing resistor via which the source-drain path of the MOSFET is coupled between the first and second switch terminals, and control means responsive to an excessive current flowing through the current-sensing resistor for controlling a logic level at the control terminal to render the source-drain path of the MOSFET non-conductive.

To provide for automatic resetting of such an interrupter, the control means preferably comprises a monostable circuit responsive to the excessive current for maintaining the logic level at the control terminal to render the source-drain path of the MOSFET non-conductive for a predetermined period, and for controlling the logic level at the control terminal to render the source-drain path of the MOSFET conductive at the end of the predetermined period.

BRIEF DESCRIPTION OF THE DRAWINGS

The invention will be further understood from the following description with reference to the accompanying drawings, in which.

DETAILED DESCRIPTION

Figure 1:
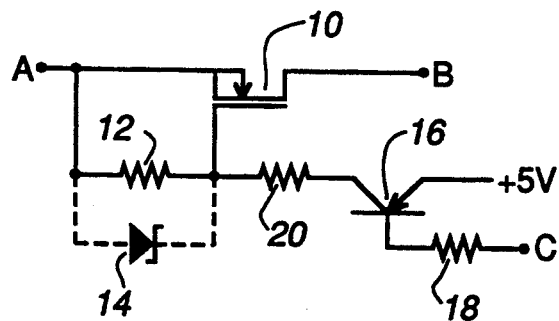
FIGS. 1 to 5 schematically illustrate various forms of electronic switch in accordance with the invention.

Referring to FIG. 1, an electronic switch in accordance with an embodiment of the invention comprises an n-channel MOSFET 10 having a source connected to a terminal A and a drain connected to a terminal B to provide a controllably switched path between the terminals A and B. A gate of the MOSFET 10 is connected via a resistor 12 to the source of the MOSFET 10 and hence also to the terminal A, and as shown by dashed connection lines optionally and preferably a zener diode 14 is connected in parallel with the resistor 12.

For controlling the MOSFET 10, a PNP bipolar transistor 16 has its emitter connected to a supply voltage of for example +5 volts as illustrated, its base connected via a current limiting resistor 18 to a control terminal C which for example is controlled by CMOS logic circuitry (not shown) to have a potential of controllably 0 or +5 volts, and its collector connected via a resistor 20 to the gate of the MOSFET 10.

By way of example, the MOSFET 10 may be a type BS107 MOSFET for switching signals with voltages up to about 100 volts and currents up to about 10 amps, and the transistor 16 may be a type A56 transistor. The potential at the terminal A is negative with respect to the 0 volt level of the control signal at the control terminal C, and for example can be in a range from about −3 to about −100 volts for the BS107 MOSFET. The potential at the terminal B is more positive than the potential at the terminal A by up to the maximum drain-source voltage of the MOSFET, and thus can be floating with respect to the 0 volt level of the control signal.

For telecommunications equipment in particular, which is typically required to switch signals related to a −48 volt supply from a telephone central[office battery, the terminal A may have a potential of about −48 volts and the terminal B may be at an arbitrary potential more positive than this. In such a situation, the resistors 12, 20, and 18 can for example have resistances of 10 kΩ, 37 kΩ, and 5 kΩ respectively. The zener diode 14 has a zener voltage which is equal to or greater than the gate-source threshold voltage of the MOSFET 10, typically about 3 volts, and is not greater than the maximum gate-source threshold voltage of the MOSFET 10, typically about 20 volts. For example, the zener voltage is about 3 volts.

The components 12, 14, and 20 together constitute a potential divider between the collector of the bipolar transistor 16 and the terminal A or the source of the MOSFET 10, with a tapping point coupled to the gate of the MOSFET 10.

When the control signal at the control terminal C is about +5 volts, there is no base-emitter bias for the transistor 16 which accordingly is non-conductive so that substantially no current flows through the resistors 12 and 20 or through the zener diode 14. The gate-source bias of the MOSFET 10 is therefore substantially zero, so that the MOSFET is turned off and presents a very high impedance (typically greater than 10 MΩ) between the terminals A and B, corresponding to an open-switch state.

Conversely, when the control signal at the control terminal C is about 0 volts, the base-emitter junction of the transistor 16 is forward biassed to render this transistor conductive, the base current being limited to less than 1 mA by the resistor 18. Current then flows from the +5 volt supply via the emitter-collector path of the transistor 16, the resistor 20, and the resistor 12 and zener diode 14 if it is provided, to the terminal A which it will be recalled is at a negative potential. The current through the resistor 12 produces a voltage drop across this resistor which exceeds the gate-source threshold voltage of the MOSFET 10, causing the MOSFET 10 to become conductive and present a low impedance (typically about 1 Ω) between the terminals A and B, corresponding to a closed-switch state.

With the parameters given above, the current conducted via the emitter-collector path of the transistor 16 is limited to about 0.3 to 2 mA for potentials at the terminal A from about −10 to −100 volts for all of which the gate-source threshold voltage of the MOSFET 10 is exceeded to cause the MOSFET to conduct. If the, zener diode 14 is present, it serves to limit the voltage dropped across the resistor 12 to the zener voltage, so that the maximum gate-source voltage of the MOSFET 10 is not exceeded even with an excessive-magnitude negative potential at the terminal A. In this case the current conducted via the emitter-collector path of the transistor 16 is only slightly increased, to about 2.5 mA for a potential of −100 volts at the terminal A. Thus it can seen that the control current required through the transistor 16 to turn on the MOSFET 10 is very small, so that the electronic switch has a very low power consumption and dissipation.

It should be appreciated from the above description that the terminal B can be at a relatively arbitrary potential relative to the control signal and supply voltage, so that the switch can be used for switching in a floating manner with respect to fixed potentials. At the same time, the switch is controlled via a very simple driver stage which does not require high voltage levels for its operation. Thus the electronic switch can be easily controlled by, for example, CMOS logic circuitry in a convenient manner.

Figure 2:
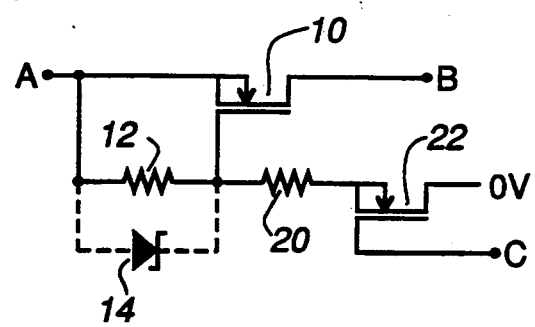

FIG. 2 illustrates an alternative form of the electronic switch, which is the same as that of FIG. 1 except in that the bipolar transistor 16 and current limiting resistor 18 are replaced by an n-channel MOSFET control transistor 22 whose gate, source, and drain are connected to the control terminal C, the resistor 20, and a 0 volt supply respectively. The operation of the switch of FIG. 2 is the same as that of FIG. 1, except that the MOSFETs 22 and 10 are rendered conductive with a +5 volt control signal at the terminal C and are rendered non-conductive with a 0 volt control signal at the terminal C.

Figure 3:
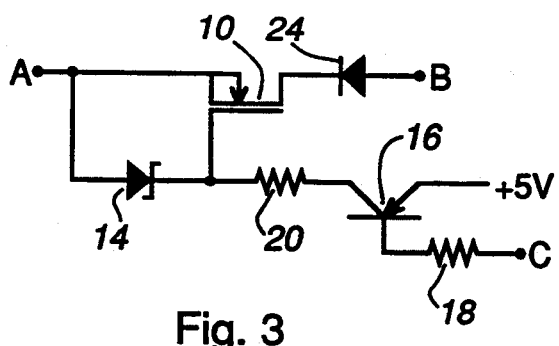

FIG. 3 illustrates another alterative form of the electronic switch, which is the same as that of FIG. 1 except that a diode 24 is connected between the drain of the MOSFET 10 and the terminal B to protect the MOSFET 10 against reversed polarity of voltage applied to the terminals A and B, and the resistor 12 is omitted, only the zener diode 14 being connected between the gate and the source of the MOSFET 10. The operation of this electronic switch is substantially the same as that of the switch of FIG. 1.

It can be seen, therefore, that either the resistor 12 or the zener diode 14, or both, can be provided between the gate and source of the MOSFET 10, in each case it being necessary only that a voltage between the threshold and maximum gate-source voltages of the MOSFET 10 be dropped to rendor the MOSFET 10 conductive when the transistor 16 conducts.

Figure 4:
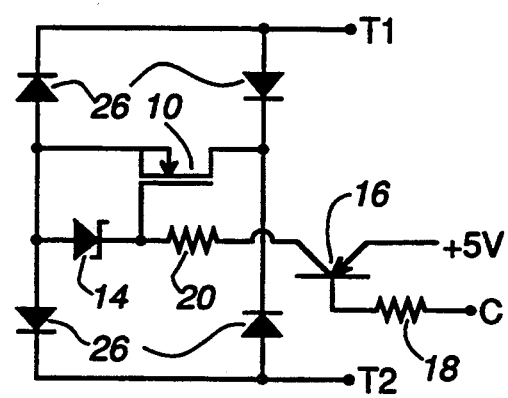

FIG. 4 illustrates an arrangement of an electronic switch, similar to that of FIG. 3 except for the diode 24, with its terminals A and B connected via a diode bridge rectifier, formed by diodes 26, to terminals T1 and T2 between which an a.c. signal to be switched may be present. Thus the electronic switch can also be used in this manner for switching of a.c. signals.

Figure 5:
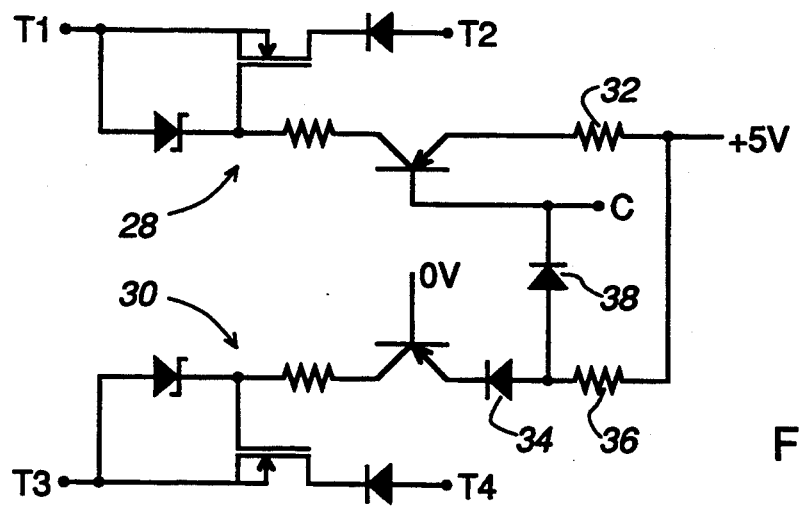

FIG. 5 illustrates an electronic switch constituted by a switch 28 having terminals T1 and T2, and a switch 30 having terminals T3 and T4, which are commonly controlled by a control signal supplied to a control terminal C. Each switch is the same as the switch of FIG. 3, except that the current limiting resistor 18 is in each case dispensed with. The control transistor of the switch 28 has its emitter connected via a current limiting resistor 32 to the +5 volt supply and its base connected to the control terminal C. The control transistor of the switch 30 has its base connected to a 0 volt supply and its emitter connected via a forward biassed diode 34 in series with a current limiting resistor 36 to the +5 volt supply. A diode 38 is connected between the control terminal C and the junction between the diode 34 and resistor 36. The arrangement is such that the switch 28 is closed and the switch 30 is open when the control terminal is at about 0 volts, the diode 38 then being forward biasseal so that there is substantially no bias voltage for the baseemitter junction of the control transistor of the switch 30. With the control terminal C at about +5 volts, the control transistor of the switch 28 receives no base-emitter bias, the diode 38 is reverse biassed, and the control transistor of the switch 30 is rendered conductive, so that the switch 28 is open and the switch 30 is closed.

With the switch of FIG. 5, the terminals T1 and T3 can be connected together to form a single-pole double-throw switch with a common negative terminal, or alternatively the terminals T2 and T4 can be connected together to form a single-pole double-throw switch with a common positive terminal. As a further alternative, the terminals T1 and T4 can be connected together, and the terminals T2 and T3 can be connected together, to form a switch which can selectively conduct current in either direction depending on the voltage at the control terminal C.

Electronic switches as described above can be used not only for purely switching applications, such as to replace mechanical relay contacts, but also with appropriate control circuitry to provide a replacement for a thermal fuse or overcurrent circuit interrupter, which can be arranged to be automatically resettable.

Figure 6:
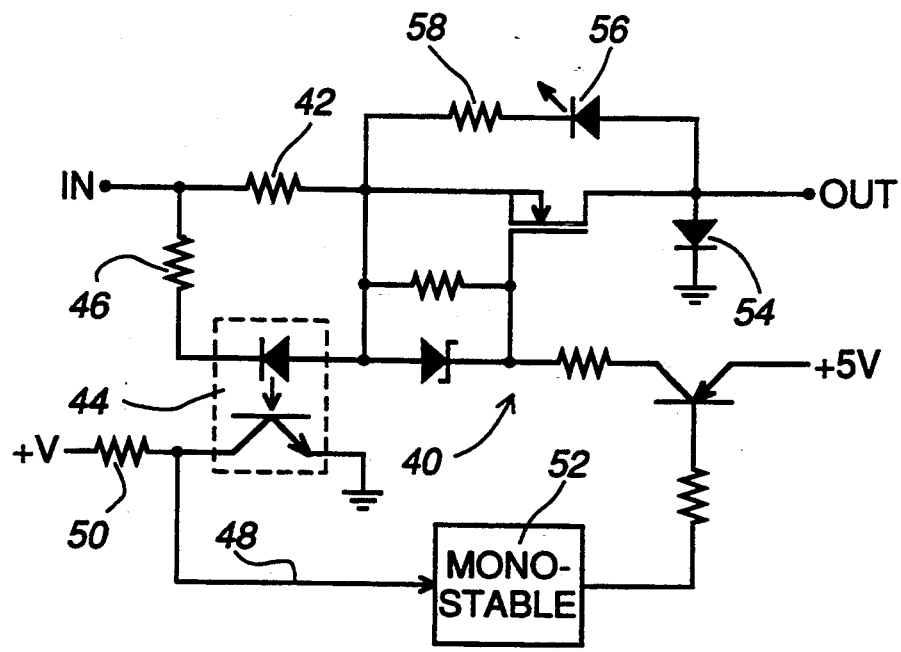
FIGS. 6 and 7 schematically illustrate automatically-resetting interrupters using an electronic switch in accordance with the invention.

For example, FIG. 6 shows an electronic switch 40 which is the same as that of FIG. 1 described above including both the resistor 12 and the zenm diode 14. The switch 40 is connected in series with a current sensing resistor 42 between an input terminal IN and an output terminal OUT. The input terminal IN is connected to the output of a d.c. supply (not shown), which may for example be a −48 volt battery supply for telecommunications equipment as already discussed above. An optocoupler 44 comprises a light emitting diode, which is connected in series with a current limiting resistor 46 in parallel with the resistor 42 so that the diode emits light when a threshold level of current through the resistor 42 is exceeded, and a photo-transistor having an output on a line 48 and biassed from a supply voltage +V, relative to ground or 0 volts, via a resistor 50. The line 48 is connected to a trigger input of a monostable circuuit 52 which has an output constituting the control signal for the switch 40. The circuit of FIG. 6 also includes a protection diode 54 connected between the output terminal OUT and ground and which is normally reverse biased by the negative (relative to ground) output voltage, and a light emitting diode 56 in series with a current limiting resistor 58 connected in parallel with the source-drain path of the MOSFET of the switch 40.

In normal operation of the circuit of FIG. 6, the current through the resistor 42 is not sufficient for the optocoupler 44 to trigger the monostable circuit 52, whose output is consequently at about 0 volts to maintain the switch 40 closed, the diode 56 being unbiassed so that it does not emit light. In the event of an excess; current through the resistor 42, the optocoupler 44 triggers the monostable circuit 52 to cause its output to become about +5 volts, thereby opening the switch 40 and interrupting the excess current, for the monostable period which may be of any desired duration. The diode 56 is then forward biased so that it emits light indicating opening of the switch.

At the end of the monostable period, the output of the monostable circuit 52 again becomes about 0 volts to close the switch 40. If an excess current again flows, then the monostable circuit is again triggered as described above to open the switch 40, and this cycle is repeated for as long as an excessive current flows on each momentary closing of the switch 40. If and when an excessive current does not flow on such closing of the switch 40, the monostable circuit 52 is no longer triggered and the switch 40 remains closed, whereby normal operation is automatically resumed. The circuit of FIG. 6 thus operates as an automatically reset electronic fuse or circuit interrupter.

Figure 7:
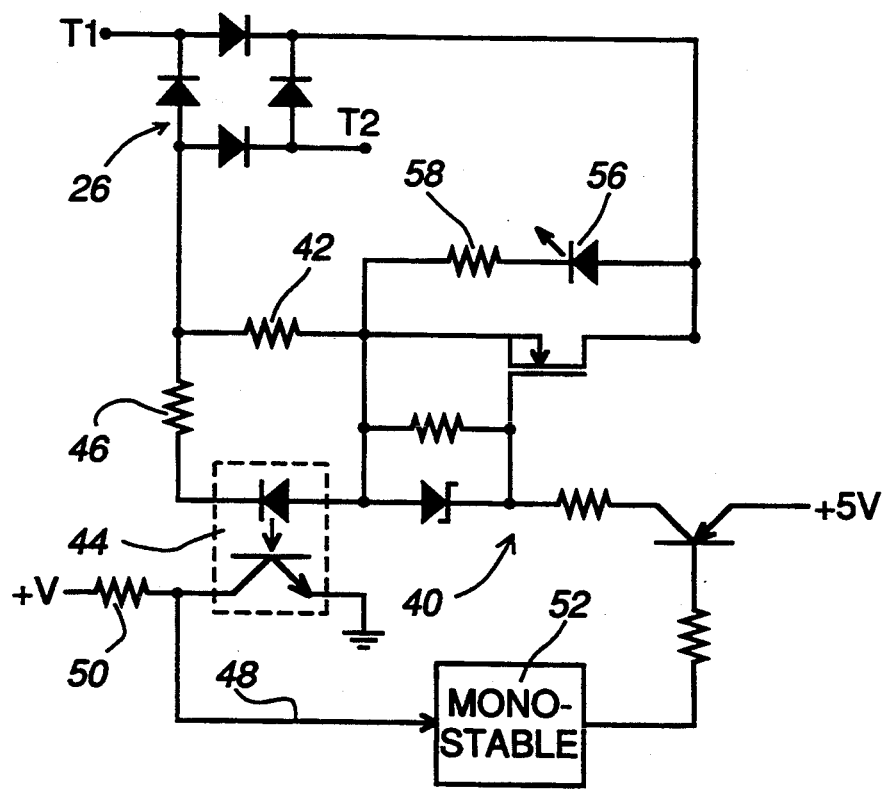

For providing an electronic fuse for a.c. supplies, the circuit of FIG. 6 can be used together with a diode bridge rectifier, in a similar manner to that described above with reference to FIG. 4 for the electronic switch alone, as shown in FIG. 7. The arrangement in FIG. 7 is the same as that of FIG. 6 except that the diode 54 is dispensed with and the series combination of the resistor 42 and switch 40 is coupled to a.c. terminals T1 and T2 via a diode bridge rectifier constituted by diodes 26 as in FIG. 4.

In the arrangements of FIGS. 6 and 7, instead of the monostable circuit 52 a bistable circuit could instead be used, this being triggered to change from a first state in which the switch 40 is conductive to a second state in which the ,switch 40 is nonconductive in response to an excess current through the sensing resistor 42 in the same manner as described above, and being triggered to change from the second state to the first state in response to an externally-supplied resetting signal.

Although particular embodiments of the invention have been described in detail, it should be appreciated that numerous modifications, variations, and adaptations may be made without departing from the scope of the invention as defined in the claims.

What is claimed is:

1. An electronic switch, for switching relatively high voltages in response to relatively low voltage logic levels at a control terminal, comprising:

a MOSFET having a source coupled to a first switch terminal, a drain coupled to a second switch terminal, and a gate, a source-drain path of the MOSFET constituting a switching path of the electronic switch between the first and second switch terminals;

a control transistor having a controlled path, coupled on one side to a relatively low voltage terminal, and a control electrode coupled to the control terminal for rendering the controlled path of the control transistor conductive or non-conductive in response to respective logic levels at the control terminal; and a potential divider coupled between the first switch terminal and another side of the controlled path of the control transistor and having a tapping point coupled to the gate of the MOSFET, for rendering the source-drain path of the MOSFET conductive or non-conductive when the controlled path of the control transistor is respectively conductive or non-conductive.

2. An electronic switch as claimed in claim 1 wherein the potential divider comprises a zener diode coupled between the first switch terminal and the tapping point.

3. An electronic switch as claimed in claim 1 wherein the potential divider comprises a resistor coupled between the first switch terminal and the tapping point.

4. An electronic switch as claimed in claim 1 wherein the potential divider comprises a zener diode and a resistor, in parallel with one another, coupled between the first switch terminal and the tapping point.

5. An electronic switch as claimed in claim 1 wherein the control transistor comprises a bipolar transistor having a base-emitter path coupled via a resistor between the control terminal and the relatively low voltage terminal and having a collector constituting said one side of the controlled path of the control transistor.

6. An electronic switch as claimed in claim 1 wherein the control transistor comprises a field effect transistor having a gate coupled to the control terminal and having a source drain path constituting the controlled path of the control transistor.

7. An electronic switch as claimed in claim 1 and including at least one diode via which the source-drain path of the MOSFET is coupled between the first and second switch terminals.

8. An electronic switch as claimed in claim 1 and including a diode bridge rectifier via which the source-drain path of the MOSFET is coupled between the first and second switch terminals.

9. An electronic switch as claimed in claim 1 and including a current-sensing resistor via which the source-drain path of the MOSFET is coupled between the first and second switch terminals, and control means responsive to an excessive content flowing through the current-sensing resistor for controlling a logic level at the control terminal to render the source-drain path of the MOSFET non-conductive.

10. An electronic switch as claimed in claim 9 wherein the control means comprises a monostable circuit responsive to the excessive current for maintaining the logic level at the control terminal to render the source-drain path of the MOSFET non-conductive for a predetermined period, and for controlling the logic level at the control terminal to render the source-drain path of the MOSFET conductive at the end of the predetermined period.

11. An electronic switch as claimed in claim 10 and including a diode bridge rectifier via which the source-drain path of the MOSFET is coupled between the first and second switch terminals.

* * * * *